US008547174B1

(12) United States Patent
Schemmann et al.

(10) Patent No.: US 8,547,174 B1
(45) Date of Patent: *Oct. 1, 2013

(54) BROADBAND LINEARIZER WITH COMBINED SECOND AND THIRD ORDER GENERATION WITH ADJUSTABLE TILT

(75) Inventors: Marcel F. Schemmann, Maria Hoop (NL); Shamsuddin H. Chasmawala, Middletown, CT (US)

(73) Assignee: ARRIS Enterprises, Inc., Suwanee, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/361,154

(22) Filed: Jan. 30, 2012

Related U.S. Application Data

(60) Provisional application No. 61/437,440, filed on Jan. 28, 2011.

(51) Int. Cl.
*H03F 1/26* (2006.01)
(52) U.S. Cl.
USPC ................. 330/149; 330/124 R; 330/295

(58) Field of Classification Search
USPC .................... 330/149, 124 R, 295
See application file for complete search history.

(56) References Cited

U.S. PATENT DOCUMENTS

| | | | | | |
|---|---|---|---|---|---|
| 5,282,072 | A | * | 1/1994 | Nazarathy et al. | 398/193 |
| 5,424,680 | A | * | 6/1995 | Nazarathy et al. | 330/149 |
| 5,430,568 | A | * | 7/1995 | Little et al. | 398/81 |
| 5,966,049 | A | * | 10/1999 | Yuen et al. | 330/149 |
| 6,313,701 | B1 | * | 11/2001 | Mussino et al. | 330/149 |
| 6,917,764 | B1 | * | 7/2005 | Wilson | 398/193 |
| 6,985,020 | B2 | * | 1/2006 | Zhou | 327/317 |
| 7,332,961 | B2 | * | 2/2008 | Blednov | 330/149 |
| 8,073,340 | B2 | * | 12/2011 | Ishaug et al. | 398/193 |
| 8,121,493 | B2 | * | 2/2012 | Zheng et al. | 398/194 |

* cited by examiner

*Primary Examiner* — Patricia Nguyen
(74) *Attorney, Agent, or Firm* — Troy A. Van Aacken

(57) ABSTRACT

Systems and methods can provide an improved broadband linearizer that includes a distortion generator with a bypass path for generating both composite triple beat (CTB) and composite second order (CSO) distortions suitable for linearizing a laser. The linearized laser can be suitable for injection into a communications network such as, for example, a hybrid fiber coaxial (HFC) network, among others.

19 Claims, 1 Drawing Sheet

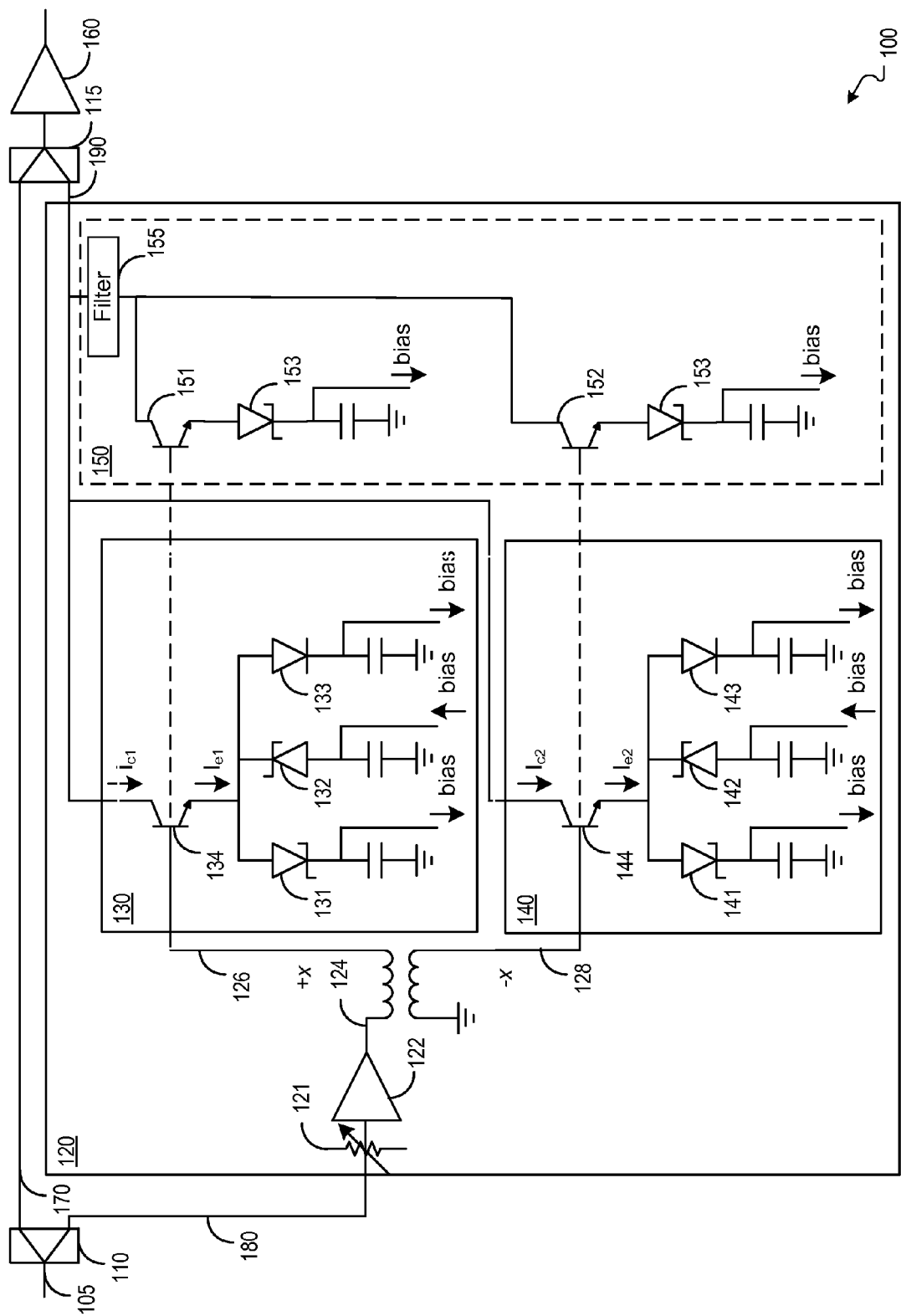

BROADBAND LINEARIZER WITH COMBINED SECOND AND THIRD ORDER GENERATION WITH ADJUSTABLE TILT

RELATED APPLICATIONS

This application claims priority as a non-provisional of U.S. Provisional Patent Application Ser. No. 61/437,440, entitled "Broadband Linearizer with Combined Second and Third Order Generation with Adjustable Tilt," filed Jan. 28, 2011, which is incorporated herein by reference in its entirety.

TECHNICAL FIELD

This disclosure relates to a broadband linearizer where distortion amplitude and phase matching is performed over a frequency range.

BACKGROUND

Linearizers can be used in broadband communication equipment where linearization is desired over a wide frequency range. The linearization can perform distortion amplitude and phase matching over a wide frequency range. Generally the distortion amplitude and phase follow a smooth function of frequency.

WIPO Application No. PCT/US2006/023641 (WIPO Application), which is incorporated by reference in its entirety herein, teaches a full quadrant linearizer that can cover wide amplitude and phase range for composite second order distortion (CSO). The WIPO Application discloses in FIG. 2 a linearizer with an in-phase distortion generation function and a quadrature distortion generation. The distortion generator can generate frequency independent second order distortion with positive or negative phase (in-phase) and frequency dependent second order components that have a quadrature phase. A frequency dependent in-phase component can be desired and would require modification to the distortion generator disclosed in FIG. 2 of the WIPO Application. Generation of second and third order distortion can be desired, and can be done with a separate second and third order distortion generation path.

U.S. Pat. No. 5,132,639, ('639 patent) which is incorporated by reference in its entirety herein, teaches generation of second and third order distortion (CTB or composite triple beat) in separate bypass paths that are recombined into a main signal path. The '639 patent discloses a distortion generator in FIG. 6 with one path for second order distortion generation that includes a distortion generator, a filter to adjust the frequency dependence of the distortion output and a delay that is used to adjust the frequency dependence of the distortion phase. These components permit setting any particular amplitude and phase dependence of the generated distortion, but are not flexible in setting variable distortion amplitude and phase as taught in the WIPO Application. The '639 patent also discloses a second path for CTB generation with adjustable amplitude and phase.

U.S. Pat. Nos. 6,574,389 ('389 patent) and 6,593,811 ('811 patent) which are incorporated by reference in their entirety herein, teach in-line distortion generation where the distortion can be generated in the main signal path with a feedback path of amplifiers altered by a non-linear element that modifies the amplifier distortion output. The in-line pre-distortion disclosed in the '389 patent and '811 patent provides a simple implementation to generate distortion but introduces complexity in dealing with device parasitics that affect the main signal gain and distortion generation and limit freedom in adjusting distortion generation amplitude and phase independently of main signal path gain.

The feedback distortion generation as shown in FIG. 2 of the '811 patent can be applied to the emitter path of RF transistors, where the impedance is low and the circuit behavior may not be affected significantly by parasitic capacitance of distortion generating components such as Schottkey diodes. Some implementations can include the use of multiple Schottkey diodes and other distortion generating components (e.g., varactors) and gain adjusting elements (e.g., PIN diodes) all at once at a single emitter node. As a result the feedback networks can be built such that one transistor or gain block can simultaneously generate CSO and CTB and optionally a frequency dependence thereof. As the impedance of the feedback network changes, the gain of the transistor stage changes, which can cause an unwanted variation of the linear signal gain. By adding a variable resistor in the feedback network such as a PIN diode the feedback network impedance can be controlled to obtain or maintain a desired linear gain. One implementation of a distortion generator of this type could be used in the main path intended in the '811 patent. However, main path signal levels are often high, and combining the high power capability of a main path amplifier with a capability to generate variable distortion amplitude and phase and distortion frequency dependence is complex. In another implementation feedback distortion generation in a bypass path permits independent control of distortion amplitude and phase and also frequency dependence using a small number of low power RF transistors.

SUMMARY

Systems and methods can operate to provide broadband linearization operable to generate frequency independent second and third order distortions and frequency dependent amplitude distortions. Systems can include a splitter operable to receive an input signal and to split the input signal into a first signal and a second signal, a distortion generator operable to receive the second signal and to generate a third signal, the distortion generator comprising: one or more amplifiers, one or more non-linear elements, and wherein, the one or more amplifiers and one or more non-linear elements are operable to generate second and third order distortions through adjustable bias currents, and a combiner operable to combine the first and third signals. Methods can include receiving a input signal, splitting the input signal into a first and second signal, generating one or more adjustable second and third order distortion signals from the second signal, generating one or more adjustable frequency dependent amplitude and phase distortion signals from the second signal, producing a third signal through combining the second and third order distortions signals with the frequency dependent amplitude and phase distortion signals, and combining the first and third signals.

BRIEF DESCRIPTION OF THE DRAWINGS

FIG. 1 is a block diagram illustrating an example of an improved broadband linearizer.

DETAILED DESCRIPTION

In some implementations of this disclosure, methods, systems, and apparatuses can operate to provide a compact distortion generator with CSO and CTB output, adjustable distortion amplitude, and phase and frequency dependence with minimal impact on main signal path gain.

FIG. 1 is a block diagram illustrating an example of an improved broadband linearizer. In one implementation the broadband linearizer 100 can have input 105, a signal splitter 110, a combiner 115 and a distortion generator 120. Following the combiner 115 there can be an output amplifier 160, which can have additional quadrature distortion generating components as disclosed in the '811 patent. Signal splitter 110 can split the input signal 105 into a main signal path 170 and a distortion path 180. Combiner 150 recombines the distortion generator output 190 into the main signal path 170.

The distortion generator 120 in some implementations can have an amplifier 122 and a balun 124. The balun 124 can be used to generate a positive +x and negative −x phase of the input signal 180. Each signal phase 126 and 128 can be used to drive transistor stage 130 and 140 with nonlinear feedback in the emitters. The nonlinear feedback can consist of Schottkey diodes 131, 132, 141 and 142 with individually adjustable bias current and PIN diodes 133 and 143 for impedance control.

Transistor 134 has gain and can generate a distortion output collector current $I_{c1}$ for the positive signal input phase +x.

$$I_{c1} = A_1 x + B_1 x^2 + C_1 x^3$$

Transistor 144 has gain and can generate a distortion output collector current $I_{c2}$ negative for the negative signal input phase −x.

$$I_{c2} = -A_2 x + B_2 x^2 - C_2 x^3$$

RF transistors can have high collector impedance representing current sources where the collector currents can be summed.

$$I_{c\_total} = (A_1 - A_2)x + (B_1 + B_2)x^2 + (C_1 - C_2)x^3$$

The second order distortion can be readily generated in the summed output when $A_1 = A_2$, $B_1 = B_2$, and $C_1 = C_2$ but the third order distortion can also be generated by choosing $B_1 = B_2 = 0$ and $C_1 \neq 0$ or $C_2 \neq 0$. Setting C>0 generally implies that A will also become nonzero so that the linear gain becomes dependent on $C_1$, however by controlling $A_2$ such that $A_2 = A_1$ there is no effect on the linear gain which can be held at zero if desired. $A_1$ and $A_2$ can readily be controlled without affecting $C_1$ or $C_2$ by adjusting current in the PIN diodes 133 and 143.

The control of the second order coefficients B and third order coefficients C can be done by adjusting the Schottkey diode currents. The input voltage to the transistor base is also present at the emitter which follows the transistor base voltage due to the high current gain of the transistors 134 and 144. The current through the Schottkey diodes is part of the transmitter emitter current that is provided nearly 1:1 to the collectors, therefore the distortion current in the collector of a transistor can be found by analyzing the current in the Schottkey diodes. The emitter voltage of transistor 134 follows the input signal x, the current in Schottkey diode 131 can be $I_{s1} = I_o (\exp((x+V_{bias1}/V_{th})-1))$ where the thermal voltage $V_{th} = kT/q$ (q represents the electron charge, k the Boltzmann constant and T the temperature). $I_o$ represents the diode saturation current. The diode can be kept in a forward bias such that the current in Schottkey diode 131 can be simplified to $I_{s1} = I_{bias1} \exp(x/V_{th})$. The current for the reversed polarized Schottkey diode 135 can be represented as $I_{s2} = I_{bias2} \exp(-x/V_{th})$. A Taylor series expansion of the exponential functions results in:

$$I_{s1} = I_{bias1}\left(\left(\frac{x}{V_{th}}\right) + 1/2\left(\frac{x}{V_{th}}\right)^2 + 1/6\left(\frac{x}{V_{th}}\right)^3\right)$$

$$I_{s2} = I_{bias2}\left(\left(\frac{-x}{V_{th}}\right) + 1/2\left(\frac{x}{V_{th}}\right)^2 - 1/6\left(\frac{x}{V_{th}}\right)^3\right)$$

The sum of the emitter current for transistor 134 is the difference of the opposite currents for polarized Schottkey diodes 134 and 135 and can be represented by.

$$I_{e1} = I_{s1} - I_{s2} = (I_{bias1} + I_{bias2})\left(\left(\frac{x}{V_{th}}\right) + 1/6\left(\frac{x}{V_{th}}\right)^3\right) + (I_{bias1} - I_{bias2})1/2(x/V_{th})^2$$

Second order distortion content can be created by adjusting the bias currents of Schottkey diodes 131 and 132 to $$B1 = (I_{bias1} - I_{bias2}) * \frac{1}{2} * \left(\frac{1}{V_{th}}\right)^2$$

where the two bias currents are not equal. The second order distortion component can be minimized when the bias currents of Schottkey diodes 131 and 132 are equal and can result in a third order component of $$C_1 = (I_{bias1} + I_{bias2}) * \frac{1}{2} * \frac{1}{3} * \left(\frac{1}{V_{th}}\right)^3.$$

The linear signal term can be $$A_1 = (I_{bias1} + I_{bias2}) * \left(\frac{1}{V_{th}}\right).$$

At each transistor 134 and 144 there can be a PIN diode 133 and 143 connected to the emitter of each transistor respectively. At transistor 144 the Schottkey diodes 141 and 142 can each have a bias current equal to zero where a non-zero bias current on PIN diode 143 can result in a impedance of $R_{PIN} = Z_{nom} * I_{nom}/I_{bias\_pin}$ where $Z_{nom}$ represents the PIN diode 143 nominal impedance at a reference bias current $I_{nom}$ and $I_{bias\_pin}$ is the actual PIN diode 143 bias current. A signal −x at the base of transistor 144 can result in an emitter current of $I_{e2} = -x/R_{PIN} = -x*I_{bias\_pin}/(Z_{nom}*I_{nom})$ and can result in $A_2 = I_{bias\_pin}/(Z_{nom}*I_{nom})$.

PIN diode 143 can be a linear element and can result in of distortion coefficients $B_2$ and $C_2$ approximating zero if the currents in Schottkey diodes 141 and 142 at transistor 144 are set to zero. The combined collector current of transistor 134 and 144 can be $C_1 * x^3$ in the example given and can result in the generation of a third order distortion without second order distortion or linear gain. By adjusting the Schottkey diode 131, 132, 141 and 142 and PIN diode 133 and 143 currents, the linear gain, second and third order distortion components can be varied in amplitude including the sign.

A multitude of transistor pairs 151 and 152 can be driven with additional distortion generating elements in their emitters with Schottkey diodes 153 and 154. The collector outputs of transistors 151 and 152 can be provided to one or more filters 155 and can provide frequency dependent amplitude and phase distortion. The outputs of the one or more filters 155 can be connected to distortion path 180 and can provide a number of frequency dependent amplitude and phase distortion profiles where a combination thereof can be set by adjusting the various Schottkey diode bias currents. For instance a distortion profile with increasing distortion as a function of frequency can be set with an in-phase distortion vector. The degree of frequency dependence can be adjusted by adjusting the amount of distortion generated by frequency dependent 150 and frequency independent 130 and 140 stages. Optionally variable attenuators 121 can be added at distortion generator input and output (not shown) to further add to the level control.

The distortion generator output signal 190 can be combined with the main path signal 170; adjustment of the distortion phase relative to the main path signal phase can be done by setting the correct delay on the main path signal 170, typically to match the delay of the distortion generator 120. The distortion generator 120 can be used to cancel distortion of a laser diode in an optical transmitter. The distortion phase of the CTB generated by the laser can be related to that of one or more components of the CSO generated by the laser, they are just part of the same nonlinear transfer curve. Therefore a combination of CSO and CTB can be generated by the same transistors and a separate path for CTB as in the WIPO Application is not required.

In other implementations a plurality of distortion generators (not shown) can be placed in the distortion generating bypass path 190 each with a different amplitude and phase dependence on frequency.

What is claimed is:

1. A broadband linearizer system, comprising:
    a splitter operable to receive an input signal and to split the input signal into a first signal and a second signal;
    a distortion generator operable to receive the second signal and to generate a third signal, the distortion generator comprising:
        one or more amplifiers;
        one or more non-linear elements; and
        wherein the one or more amplifiers and one or more non-linear elements are operable to generate second and third order distortions through adjustable bias currents, and wherein the amplifiers comprise transistors including one or more Schottkey diodes in the emitter feedback path of the amplifiers; and
    a combiner operable to combine the first and third signals.

2. The system of claim 1, wherein the distortion generator comprises a plurality of distortion generator circuits operable to generate frequency dependent amplitude and phase distortions wherein, one or more of the distortion generator circuits is operable to generate adjustable second and third distortion levels.

3. The system of claim 2, wherein the distortion generator is operable to adjust the relative contributions from the plurality of distortion generator circuits.

4. The system of claim 1, wherein the distortion generator is operable to spit the second signal into a positive phase signal and a negative phase signal.

5. The system of claim 4, wherein the positive phase signal is received by one or more distortion generating circuits and the negative phase signal is received by one or more distortion generating circuits wherein, one or more distortion generating circuits are operable to generate second and third order distortions and wherein, the distortion generator is operable to combine the outputs of the one or more distortion generating circuits generating the third output signal.

6. The system of claim 5, wherein the plurality of distortion generating circuits each having different amplitude and phase dependence on frequency comprise one or more distortion generating circuits operable to generate second and third order distortion levels.

7. The system of claim 1, wherein the distortion generator includes linear gain adjustment means operable to adjust the linear gain of third order distortions while maintaining a constant gain.

8. The system of claim 1, wherein one of the one or more amplifiers receives the second signal.

9. The system of claim 8, wherein further comprising an adjustable attenuator precedes the amplifier.

10. The system of claim 1, comprising additional in-line distortion generators.

11. A method for providing broadband linearization, comprising:
    receiving a input signal;
    splitting the input signal into a first and second signal;
    generating one or more adjustable second and third order distortion signals from the second signal, wherein one or more amplifiers and one or more non-linear elements are operable to generate second and third order distortions through adjustable bias currents, and wherein the one or more amplifiers comprise transistors having one or more Schottkey diodes in the emitter feedback path of the amplifiers;
    generating one or more adjustable frequency dependent amplitude and phase distortion signals from the second signal;
    producing a third signal through combining the second and third order distortions signals with the frequency dependent amplitude and phase distortion signals; and
    combining the first and third signals.

12. The method of claim 11, wherein adjustable distortion signals are generated based on non-linear components.

13. The method of claim 11, wherein the linear gain of the adjustable second are third order distortion signals is controllable.

14. The method of claim 11, wherein the second signal is signal is split into a positive phase signal and a negative phase signal before generating distortions.

15. The method of claim 11, wherein one of the one or more amplifiers is operable to receive the second signal prior distortion generation.

16. The method of claim 15, wherein a variable attenuator is operable to receive the second signal prior to second signal being received by the one or more the amplifiers.

17. A broadband linearizer system, comprising;
    input signal;
    a splitter operable to split the input signal into a first signal and a second signal;
    a distortion generator operable to receive the second signal;
    the distortion generator operable with means to generate adjustable frequency independent second and third order distortions, wherein the distortion generator comprises one or more amplifiers and one or more non-linear elements operable to generate second and third order distortions through adjustable bias currents, and wherein the one or more amplifiers comprise transistors having one or more Schottkey diodes in the emitter feedback path of the one or more amplifiers;
    the distortion generator further operable with means to generate adjustable frequency dependent amplitude and phase distortions;
    the distortion generator further operable to generate a third signal comprising the combined frequency dependent and independent distorted signals; and
    a combiner operable to combine the first and third signals.

18. The system of claim 17, wherein the distortion generator comprises means for generating a positive and negative phase from the second signal.

19. The system of claim 17, wherein the distortion generator comprises filtering means operable to generate frequency dependent amplitude and phase distortions.

\* \* \* \* \*